United States Patent
Fragapane et al.

[11] Patent Number: 5,963,407
[45] Date of Patent: Oct. 5, 1999

[54] OVERVOLTAGE PROTECTION DEVICE FOR THE PROTECTION OF A POWER TRANSISTOR HAVING A MOS CONTROL TERMINAL

[75] Inventors: Leonardo Fragapane, Catania; Romeo Letor, Mascalucia, both of Italy

[73] Assignee: SGS-Thomson Microelectronics S.r.L., Agrate Brianza, Italy

[21] Appl. No.: 09/020,420

[22] Filed: Feb. 9, 1998

[30] Foreign Application Priority Data

Feb. 19, 1997 [EP] European Pat. Off. .............. 97830072

[51] Int. Cl.[6] ....................................... H02H 3/00
[52] U.S. Cl. ................... 361/42; 361/18; 361/56; 361/115
[58] Field of Search ................. 361/18, 56, 91, 361/118, 117, 115, 127, 42

[56] References Cited

U.S. PATENT DOCUMENTS

| | | | |
|---|---|---|---|
| 5,072,268 | 12/1991 | Rumennilt | 357/23.4 |
| 5,453,900 | 9/1995 | Feldtkeller | 361/18 |
| 5,502,338 | 3/1996 | Suda et al. | 257/570 |
| 5,525,826 | 6/1996 | Palara | 257/378 |

OTHER PUBLICATIONS

European Search Report from European Patent Application 97830072.1, filed Feb. 19, 1997.
Revue Generale De L'Electricitie, No. 2, Feb. 1, 1994, pp. 8–12, Lorenz, L. "Drive and Protection Concepts For IGBTs".
Proceedings of the International Symposium on Power Semiconductor Devices (ISPSD), Davos, CH, May 31–Jun. 2, 1994, No. SUMP, 6, May 31, 1994, Fichtner W. (Ed), pp. 31–35, Yasukazu Seki, et al "A New IGBT With a Monolithic Over–Current Protection Circuit".

*Primary Examiner*—Stephen Jackson
*Attorney, Agent, or Firm*—Wolf, Greenfield & Sacks, P.C.

[57] ABSTRACT

A fast operating, electronic overvoltage protection device intended for a power transistor having at least one control terminal of the MOS type is disclosed. The device comprises a Zener diode associated with the power transistor and integrated together therewith in a semiconductor substrate, and a second transistor connected to the power transistor into a Darlington configuration and also connected to the Zener diode. The protection from overvoltages provided by the device is very fast in operation, and can be implemented in integrated form at reduced cost and without introducing parasitic elements.

21 Claims, 2 Drawing Sheets

OVERVOLTAGE PROTECTION DEVICE FOR THE PROTECTION OF A POWER TRANSISTOR HAVING A MOS CONTROL TERMINAL

BACKGROUND OF THE INVENTION

1. Field of Invention

This invention relates to an electronic overvoltage protection device with a fast-operation feature, intended for a power transistor having a control terminal of the MOS type. More particularly, the invention concerns a device as above, intended for a power transistor having at least one control terminal of the MOS type, which device is of the type comprising a Zener diode associated with the power transistor and jointly integrated in a substrate.

2. Discussion of the Related Art

As those skilled in the art know well, a power transistor, such as a Power-MOS or IGBT transistor, must be protected during operation against overvoltages. In particular, such a transistor is to be given protection from any overvoltages presented to its drain terminal, or collector terminal for an IGBT transistor. An overvoltage occurring across the transistor, and specifically the presentation of a high potential to either the drain or the collector terminal thereof, can have different origins. For example, an overvoltage can be caused by an emf induced by current variations in the loads being driven from the power transistor, or by a voltage peak on the power supply distribution line.

In any case, upon the occurrence of an overvoltage, a large current may flow through the transistor which can force it to operate outside its safe range, and in some cases may result in the transistor being destroyed. Some proposals for providing power transistors with protection from overvoltages are known in the prior art.

A first approach is illustrated in FIG. 1, which shows at least one high-voltage Zener diode Z placed between the collector or drain terminal C and the control or gate terminal G of the power transistor. When the voltage at the collector reaches the threshold voltage level of the Zener diode, the resulting current flow through the diode charges the gate G of the transistor, which will be turned back on and clamp the voltage on the collector terminal C to a value equal to the combined values of the threshold voltage of the Zener diode Z, Vth and the voltage drop at the gate terminal G of the transistor, Vg.

During the time when the voltage remains clamped to the value Vc, the current flowing through the Zener diode obeys the following relationship:

$$Iz = Vg/Rd = (Vth + gm*Id)/R_{goff};$$

where Vg is the voltage at the gate terminal, $R_{goff}$ is the drive resistance connected to the drain terminal which will only be at work with the Zener diode in operation, gm is the transconductance of the power transistor, and Id is the drain current.

The current Iz through the Zener diode can attain very high values, especially when the drive resistance is selected low in favor of a high transistor switching speed. The protection device including the Zener diode is usually integrated in a semiconductor, to the same electronic circuit with which the power transistor is incorporated.

The prior art proposes a first way of integrating the Zener diode together with the power transistor. FIG. 2 shows schematically a vertical cross-section, drawn to an enlarged scale, of the structure of a high-voltage Zener diode integrated to an isolation well 2 which has been doped P-. Located over the well 2 is an N- doped buried region 3 which forms a PN junction with the well 2. The well 2 and region 3 are contacted by respective anode and cathode terminations.

This type of structure has, however, certain disadvantages. The power transistor structure with which this Zener diode protector is to be associated must be modified, which involves increased fabrication complexity and higher cost; the aforementioned PN junction involves the creation of a parasitic bipolar transistor of the npn type which may be triggered on during fast transients; and a Zener diode so constructed exhibits a large thermal drift about the value of the threshold voltage.

The prior art also proposes a second approach to providing a protector, which incorporates at least one Zener diode. FIG. 3 shows schematically a vertical cross-section, also to an enlarged scale, through the structure of a high-voltage Zener diode formed of a chain 5 of polycrystalline silicon diodes. This chain of diodes comprises basically a series of PN junctions of polycrystalline silicon deposited over an oxide layer 4 which is covering a semiconductor substrate 6. Respective anode and cathode terminations are provided in contact with the opposed ends of the diode chain 5.

This second prior art approach has certain advantages. Specifically, there is no need for additional processing steps, there is an absence of parasitic components and it is stable through temperature changes.

However, a Zener diode formed of a chain of polysilicon diodes has a series resistance of relatively high value. If the resistance between the gate and source terminals of the MOS power transistor is small, the Zener voltage combines with a large voltage drop across the series resistance. This causes a rise in the clamping voltage, which may then become as high as the breakdown voltage of the power transistor.

With the resistance between the gate and source terminals corresponding to the drive resistance on which the switching time of the power transistor is dependent, it may be appreciated that the polycrystalline silicon Zener diode does not suit fast-switching circuits.

In summary, the prior art approaches have been unable to provide a voltage-clamping protection device which can be effective with high switching speeds without introducing additional fabrication process steps and parasitic elements in the power transistor.

The underlying technical problem addressed by the present invention is the problem of providing a protection device, particularly for power transistors, which has constructional and functional features to ensure high switching speeds, but involves no additional process steps for its manufacture and introduces no parasitic elements in the power transistor.

SUMMARY OF INVENTION

The solution provided by the present invention is that of isolating a portion of the circuit area occupied by the power transistor and using it as a current amplifier for a polycrystalline silicon Zener diode.

According to one embodiment of the present invention, a fast operating, electronic overvoltage protection device intended for a power transistor is disclosed. The protection device includes a first Zener diode associated with the power transistor and integrated together with the power transistor in a semiconductor substrate, and a second transistor connected to the power transistor in a Darlington configuration and also connected to the Zener diode. The first Zener diode is connected between a control terminal and a conduction terminal of the second transistor. The device further comprises a second diode connected between one terminal of the second transistor and the control terminal of the power transistor and a resistor connected between a control terminal and a conduction terminal of the second transistor. The second diode is formed of a series of junctions in a polycrystalline silicon layer deposited over an insulating oxide layer overlying the substrate of the protection device and the resistor is formed in a layer of polycrystalline silicon forming a gate region of the control terminal of the second transistor.

According to another embodiment of the invention, voltage clamp is disclosed comprising first switch means having a first terminal, a second terminal and a control terminal and second switch means having a first terminal coupled to the control terminal of the first switch means, a second terminal connected to the second terminal of the first switch means and a control terminal coupled to the first terminal of the second transistor and connected to the second terminal of the second transistor through a high voltage clamping device.

The features and advantages of a device according to the invention will be apparent from the following detailed description of an embodiment thereof, given by way of illustration and not of limitation with reference to the accompanying drawings.

DETAILED DESCRIPTION

Figure 3:
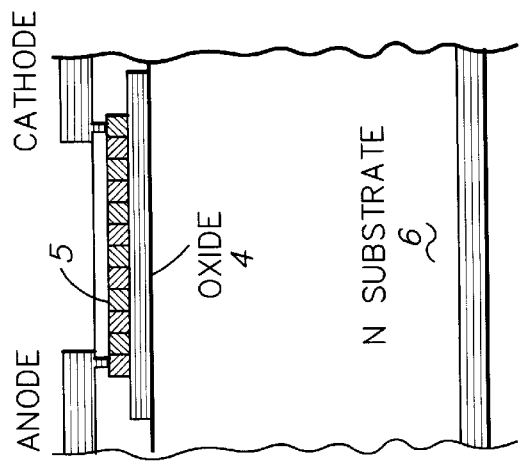
FIG. 3 shows schematically, to an enlarged scale and in vertical cross-section, the structure of another embodiment of a Zener diode as incorporated in the circuit of FIG. 1.
Figure 2:
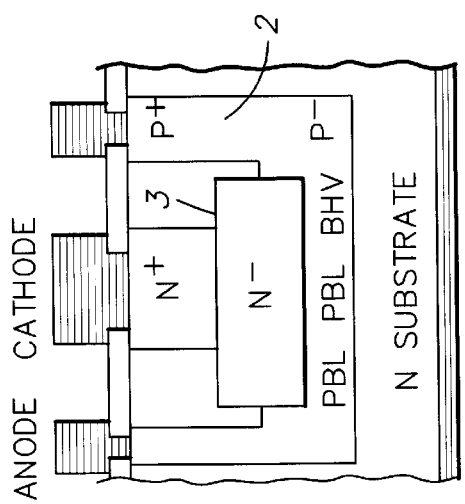
FIG. 2 shows schematically, to an enlarged scale and in vertical cross-section, the structure of a semiconductor substrate in which a Zener diode, as incorporated in the circuit of FIG. 1, has been formed.
Figure 1:
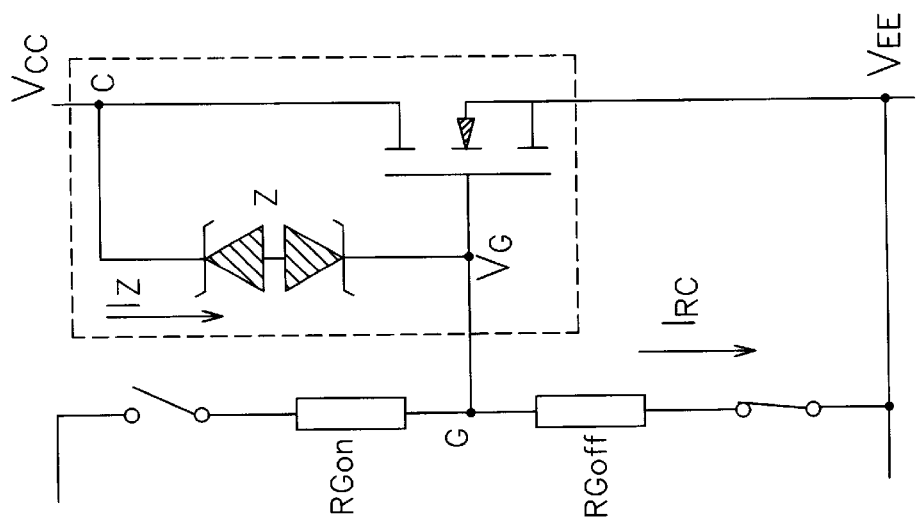
FIG. 1 is a diagrammatic view of a protection device against overvoltages as provided by the prior art for a power transistor.
Figure 4:
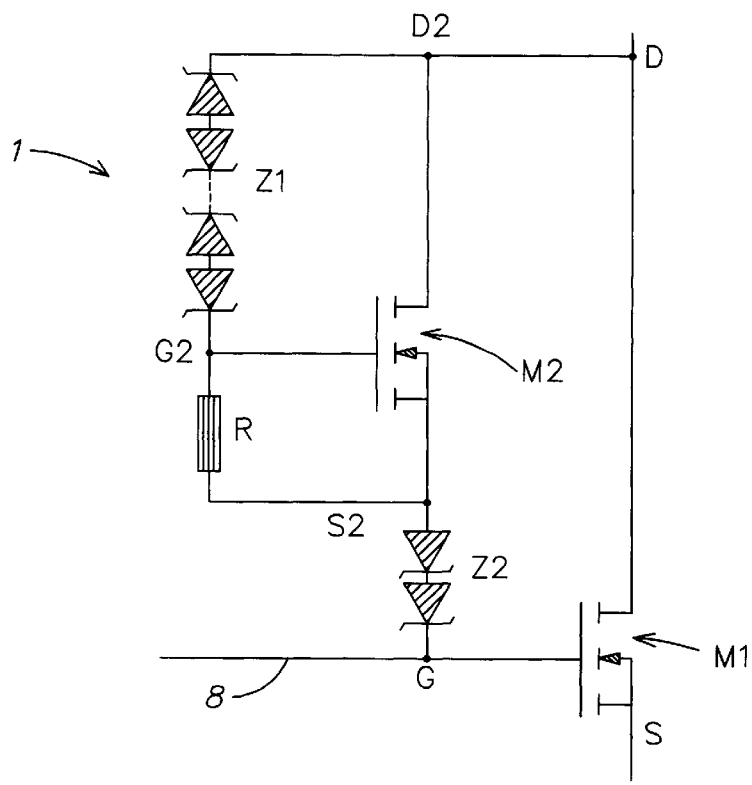
FIG. 4 is a diagrammatic view of a protection device against overvoltages as provided by the present invention for a power transistor.
Figure 5:
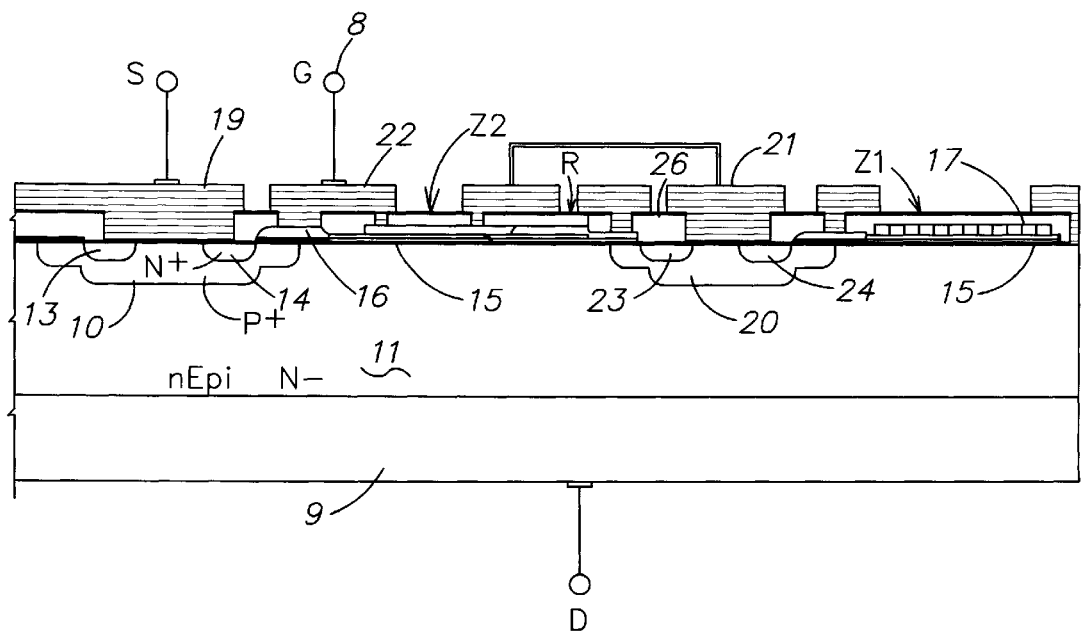
FIG. 5 shows schematically, to an enlarged scale and in vertical cross-section, the structure of a semiconductor substrate in which the device of FIG. 4 has been formed.

Referring to FIGS. 4 and 5, schematically shown at 1 is an overvoltage protection device with a fast-operation feature, intended for a power transistor M1 having an input terminal 8 of the MOS type. The transistor M1 is formed in a semiconductor substrate 9. Specifically, the transistor M1 includes a body well 10 formed in an epitaxial layer 11 doped N−, as grown over the substrate 9.

The transistor M1 is a P-channel power transistor, and may be of the MOS type. However, the transistor M1 is preferably an insulated-gate bipolar transistor or IGBT, except that it is formed with MOS technology. The transistor M1 has drain, source and gate terminals, which are respectively denoted by the references D, S and G in FIGS. 4 and 5. The drain terminal D contacts the substrate 9 directly. The body well 10 has two active source areas 13 and 14 allowing duplication of the channel region perimeter. The source terminal S contacts the pair of active areas 13 and 14 directly by means of a metallization strip 19. The areas 13 and 14 are doped N+, whereas the well 10 is doped P+.

A thin layer of insulating oxide 15 is deposited over the epitaxial layer 11, and functions as gate oxide as well in the region which is to accommodate the gate G of the transistor M1. At a very close location to this gate region, the oxide layer 15 partly overlaps the well 10 and extends sidewards therefrom, over the epitaxial layer 11. A polysilicon region 16 is provided over that portion of the layer 15 which overlaps the well 10. This region 16 represents the gate of the power transistor M1. The region 16 is contacted by a metallization strip 22 which extends to the gate terminal G. The structure of the power transistor M1 is known per se, and accordingly, will not be further discussed.

Advantageously in this invention, the protection device 1 includes a second transistor M2 connected between the drain D and gate G terminals of the power transistor M1. It should be mentioned that the second transistor M2 is connected to the power transistor M1 in a Darlington configuration. The second transistor M2 also is a P-channel MOS type of power transistor. This transistor M2 could be an IGBT. The drain, source and gate terminals of the second transistor M2 are denoted by the references D2, S2 and G2, respectively, in FIG. 4.

The structure of the transistor M2 is substantially similar to that of the transistor M1, and has its drain terminal D2 in common with the drain terminal D of the transistor M1, and coincident with the substrate 9. The source region is formed in a well 20 having active areas 23 and 24 contacted by a metallization strip 21 which extends to the terminal S2. The gate region of the transistor M2 is formed laterally of the well 20 by a polysilicon layer 26 overlying the protective oxide layer 15 that partly overlaps the well 20 at the area 23.

The device 1 further includes at least one Zener diode Z1 placed between the drain terminal D2 and the gate terminal G2 of the second transistor M2. The diode Z1 can withstand relatively high voltages, and on this account, it will be referred to as the high-voltage diode hereinafter.

Preferably, the diode Z1 is implemented with a series of PN junctions in the polycrystalline silicon formed over the protective oxide layer 15. The series of PN junctions are formed in a polysilicon layer 17 overlying the oxide layer 15 and deposited concurrently with the polysilicon layers 16 and 26 which form the gate regions of the transistors M1 and M2, respectively.

A second Zener diode Z2 is provided between the source terminal S2 of the second transistor M2 and the gate terminal G of the power transistor M1. This second Zener diode Z2 is a low-voltage diode. This second diode Z2 is preferably implemented with a series of PN junctions in the polycrystalline silicon which are formed on top of the insulating oxide layer 15.

In addition, a resistor R is placed between the gate terminal G2 and the source terminal S2 of the second transistor M2. The resistor R is formed in the polysilicon, in the same layer 26 where the gate region of the second transistor M2 is formed. The resistor R provided avoids the potential at the gate terminal G2 of the second transistor M2 being indefinite and attaining thus the breakdown value.

On the other end, the presence of the second, low-voltage diode Z2 prevents the possibility of the body-drain (well 10-substrate 9) junction of the isolated cells being forward biased when the power transistor M1 is operated in the saturation phase.

The device 1 of this invention can be easily integrated by using just one additional mask to those required to form the power transistor M1 alone. Furthermore, the single metallization level of the power transistor M1 is adequate to permit formation of the various connections between the Zener diodes Z1, Z2, the resistor R and the transistors M1, M2.

The protection device 1 according to the invention does solve the previously described technical problem, and affords a number of advantages, foremost among which is the fact that the protection from overvoltages provided by the device 1 is quite fast in operation and suitable for implementation in the integrated form at a low cost and without introducing parasitic elements.

The high speed of operation is ensured by the high-voltage Zener diode Z1, and by that the power transistor M1 is formed with a small number of elementary cells and has, therefore, a very small intrinsic capacitance. Furthermore, the switching of the power transistor M1 can be driven within a very short time, since the clamp voltage remains quite stable as the drive resistance varies. Another major benefit is represented by the good stability of the Zener voltage with changing temperature, by virtue of the Zeners being formed in the polysilicon.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A fast operating, electronic overvoltage protection device intended for a power transistor having at least one control terminal and being of the MOS type, said protection device comprising a first Zener diode having a first terminal connected to a first terminal of the power transistor and integrated together with said power transistor in a semiconductor substrate; a second transistor connected to the power transistor in a Darlington configuration and having a control terminal connected to a second terminal of the Zener diode, a first terminal coupled to the first terminal of the zener diode, and a second terminal, and a second diode connected between the second terminal of the second transistor and the control terminal of the power transistor.

2. A device according to claim 1, wherein said first Zener diode is connected between a control terminal and a conduction terminal of the second transistor.

3. A device according to claim 1, wherein said second transistor is a MOS power transistor.

4. A device according to claim 1, wherein said second transistor is of the IGBT type.

5. A device according to claim 1, wherein the power transistor and said second transistor have respective drain terminals in common.

6. A device according to claim 1, further comprising a resistor connected between a control terminal and a conduction terminal of the second transistor.

7. A device according to claim 6, wherein said resistor is formed in a layer of polycrystalline silicon forming a gate region of the control terminal of said second transistor.

8. A device according to claim 1, wherein said second diode is formed of a series of junctions in a polycrystalline silicon layer of said protection device.

9. A device according to claim 8, wherein said second diode is formed in a layer of polycrystalline silicon deposited over an insulating oxide layer overlying said substrate.

10. A voltage clamp comprising:

first switch means having a first terminal, a second terminal and a control terminal; and second switch means having a first terminal coupled to said control terminal of said first switch means through a low voltage diode, a second terminal connected to said second terminal of said first switch means and a control terminal coupled to said first terminal of said second switch means and connected to said second terminal of said second switch means through a high voltage clamping device.

11. The voltage clamp of claim 10, wherein said first and second switch means are power transistors of the MOS type, and wherein said first terminals of said first and second switch means are source terminals, said second terminals of said first and second switch means are drain terminals and said control terminals of said first and second switch means are gate terminals.

12. The voltage clamp of claim 11, wherein said high voltage clamping device comprises at least one Zener diode that comprises a series of PN junctions formed in a polycrystalline silicon layer of said voltage clamp.

13. The voltage clamp of claim 10, wherein said control terminal of said second switch means is coupled to said first terminal of said second switch means through a resistor.

14. The voltage clamp of claim 13, wherein said resistor is formed in a layer of polycrystalline silicon forming a gate region of the control terminal of said second switch means.

15. The voltage clamp of claim 13, wherein said high voltage clamping device comprises at least one Zener diode.

16. The voltage clamp of claim 15, wherein said first switch means and said high voltage clamping device are integrated together in a semiconductor substrate.

17. The voltage clamp of claim 16, wherein said second switch means comprises an IGBT transistor.

18. The voltage clamp of claim 16, further comprising a second diode connected between said first terminal of said second switch means and said control terminal of said first switch means and a resistor coupled between said control terminal of said second switch means and said first terminal of said second switch means, wherein said second diode is formed of a series of PN junctions in a polycrystalline silicon layer of said voltage clamp and said resistor is formed in said polycrystalline silicon layer at a region of said control terminal of said second switch means.

19. A power transistor device, comprising:

a first transistor having control, first, and second terminals;

a second transistor having a control terminal, a first terminal coupled to the first terminal of the first transistor, and a second terminal; and a first zener diode connected between the second terminal of the second transistor and the control terminal of the first transistor.

20. The power transistor device of claim 19, further comprising a second zener diode connected between the control and first terminals of the second transistor.

21. The power transistor device of claim 19, further comprising a resister connected between the control and second terminals of the second transistor.

* * * * *